United States Patent
Regev et al.

(10) Patent No.: US 7,107,392 B2
(45) Date of Patent: Sep. 12, 2006

(54) CONTENT ADDRESSABLE MEMORY (CAM) DEVICE EMPLOYING A RECIRCULATING SHIFT REGISTER FOR DATA STORAGE

(75) Inventors: Alon Regev, Woodland Hills, CA (US); Zvi Regev, West Hills, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/952,728

(22) Filed: Sep. 30, 2004

(65) Prior Publication Data

US 2005/0044307 A1 Feb. 24, 2005

Related U.S. Application Data

(62) Division of application No. 10/327,075, filed on Dec. 24, 2002.

(51) Int. Cl.
*G06F 12/00* (2006.01)
*G11C 15/00* (2006.01)

(52) U.S. Cl. .......................... 711/108; 365/49
(58) Field of Classification Search ................ 711/108; 365/49
See application file for complete search history.

(56) References Cited

U.S. PATENT DOCUMENTS

| | | | | | |
|---|---|---|---|---|---|
| 3,984,821 | A | * | 10/1976 | Locke | 365/49 |
| 4,065,756 | A | * | 12/1977 | Panigrahi | 365/49 |
| 4,084,260 | A | * | 4/1978 | Fleming et al. | 707/3 |
| 4,897,814 | A | * | 1/1990 | Clark | 365/49 |

OTHER PUBLICATIONS

John F. Wakely, Digital Design Principles and Practices, 1990, Prentice Hall, pp. XV, 466.*

* cited by examiner

*Primary Examiner*—Woo H. Choi
(74) *Attorney, Agent, or Firm*—Dickstein Shapiro LLP

(57) ABSTRACT

A content addressable memory (CAM) device is described including a plurality of storage locations, each arranged as a recirculating shift register, and plurality of bit comparators each coupled to a predetermined stage of a respective recirculating shift register for comparing the data contents of the predetermined stage with the data contents of a predetermined stage of a comparand register. The CAM is further coupled to a priority encoder for determining the highest priority match address.

8 Claims, 7 Drawing Sheets

US 7,107,392 B2

CONTENT ADDRESSABLE MEMORY (CAM) DEVICE EMPLOYING A RECIRCULATING SHIFT REGISTER FOR DATA STORAGE

CROSS-REFERENCE TO RELATED APPLICATIONS

This application is a divisional of application Ser. No. 10/327,075, filed on Dec. 24, 2002, which is hereby incorporated by reference in its entirety. This invention is related to U.S. Patent Application entitled "Distributed Programmable Priority Encoder Capable of Finding the Longest Match In A Single Operation" application Ser. No. 10/330,243, filed Dec. 30, 2002.

FIELD OF THE INVENTION

The present invention relates generally to content addressable memories (CAM) and, in particular, to the structure of the memory storage locations of a CAM.

BACKGROUND OF THE INVENTION

An essential semiconductor device is semiconductor memory, such as a random access memory (RAM) device. A RAM allows a memory circuit to execute both read and write operations on its memory cells. Typical examples of RAM devices include dynamic random access memory (DRAM) and static random access memory (SRAM).

Another form of memory is the content addressable memory (CAM) device. A conventional CAM is viewed as a static storage device constructed of modified RAM cells. A CAM is a memory device that accelerates any application requiring fast searches of a database, list, or pattern, such as in database machines, image or voice recognition, or computer and communication networks. CAMs provide benefits over other memory search algorithms by simultaneously comparing the desired information (i.e., data in the comparand register) against the entire list of pre-stored entries. As a result of their unique searching algorithm, CAM devices are frequently employed in network equipment, particularly routers and switches, computer systems and other devices that require rapid content searching.

In order to perform a memory search in the above-identified manner, CAMs are organized differently than other memory devices (e.g., DRAM and SRAM). For example, data is stored in a RAM in a particular location, called an address. During a memory access of a typical CAM, the user supplies an address and reads into or gets back the data at the specified address. In a CAM, however, data is stored in locations in a somewhat random fashion. The locations can be selected by an address bus, or the data can be written into the first empty memory location. Every location has at least one status bit that keep track of whether the location is storing valid information in it or is empty and available for writing.

CAMs are often used to hold routing tables for data networks. Some of these tables are "learned" from the data passing through the network. Other tables, however, are fixed tables that are loaded into the CAM by a system controller. These fixed tables reside in the CAM for a relatively long period of time.

Once information is stored in a memory location, it is found by comparing every bit in the memory with data in a comparand register. When the content stored in the CAM memory location does not match the data in the comparand register, a local match detection circuit returns a no match indication. When the content stored in the CAM memory location matches the data in the comparand register, the local match detection circuit returns a match indication. If one or more local match detect circuits return a match indication, the CAM device returns a "match" indication. Otherwise, the CAM device returns a "no-match" indication. In addition, the CAM may return the identification of the address location in which the desired data is stored or one of such addresses, if more than one address contained matching data. Thus, with a CAM, the user supplies the data and gets back the address if there is a match found in memory.

In a conventional CAM, each bit in a word/memory storage location includes a comparator, which is used to compare that bit with the corresponding bit in the comparand register. This match circuitry is costly to implement and increases the overall size of CAM devices.

SUMMARY OF THE INVENTION

The present invention provides a recirculating shift register used to store data in the memory storage locations of the CAM, which has a single match circuit at a predetermined bit location. The recirculating shift register is used to reduce the number of match circuits required for a CAM word as the bits of the CAM word are sequentially shifted to the match circuit for comparison with a corresponding bit of a search word. The recirculating shift register also provides unique features to the CAM including facilitating use of various pattern recognition algorithms for CAM words.

DETAILED DESCRIPTION OF THE PREFERRED EMBODIMENTS

Unlike a conventional CAM, which is constructed of modified random access memory (RAM) cells, in the CAM of the present invention described herein, each memory storage location in the memory array and the comparand, is constructed of dynamic master/slave flip-flops forming a recirculating serial shift register. The flip-flops work in a "bucket brigade" fashion, wherein an electrical signal is transferred from one stage of the register to the next throughout the register. Each CAM memory storage location has an output at one end of the shift register connected to the input of the shift register. Data is shifted horizontally (rotated) in an infinite circular fashion. Data is stored in a CAM memory storage location of the present invention by shifting the data in serially. Data may be stored in a comparand by serially shifting the data into the comparand or by inputting the data into the comparand in parallel. Data is read/output from a CAM memory storage location of the present invention in a serial fashion.

In the CAM of the present invention, only one bit at the end of the CAM memory storage location is equipped with a comparator in the form of an XOR gate. When the data in the memory storage location is shifted horizontally (rotated), the data in the comparand register is simultaneously rotated and the XOR gate connected to that memory storage location compares one bit of data in the register output stage of the memory storage location at a time to the corresponding bit of data in the output stage of the comparand register.

Figure 1A:
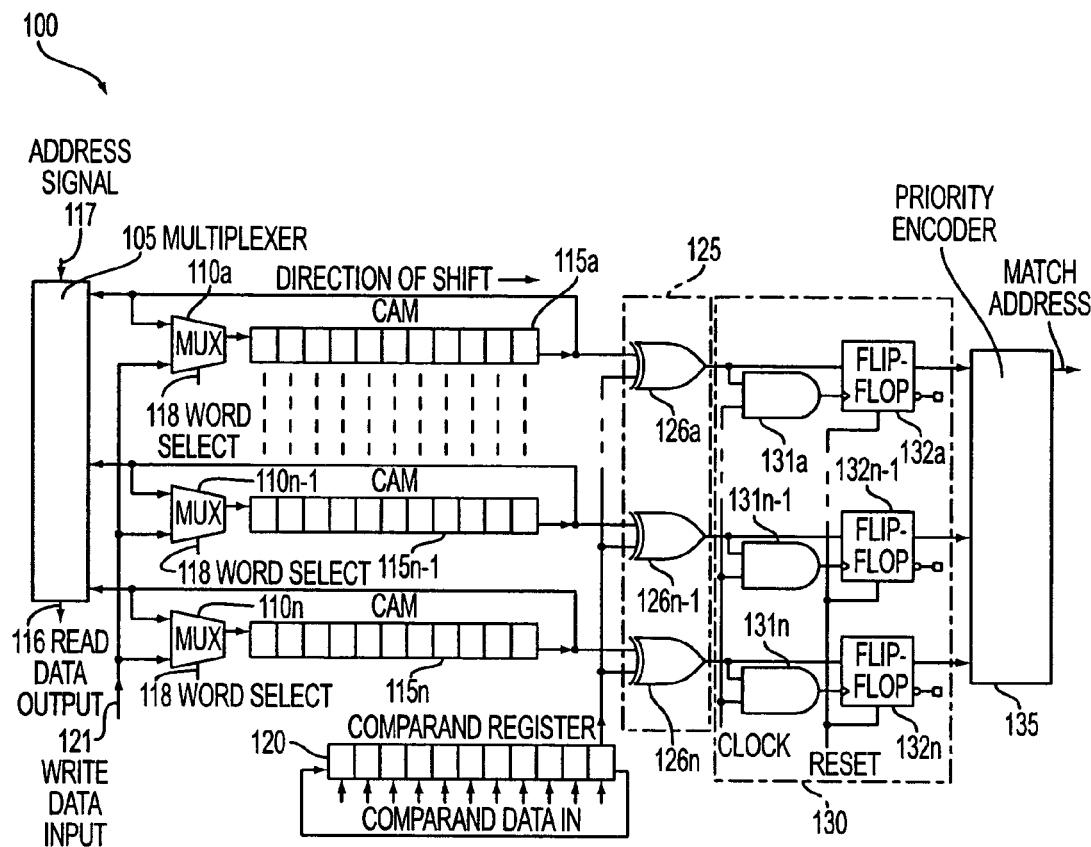
FIG. 1a is an exemplary embodiment of a serial shifting (recirculating) CAM of the present invention in block form.

FIG. 1a is an exemplary embodiment of a recirculating serial shifting CAM of the present invention in functional block form. CAM 100 includes multiplexer 105 coupled to the output stages of recirculating shift registers which function as memory storage locations 115a . . . 115n of CAM 100. Multiplexer 105 is coupled to the output stage of the memory storage location shift register 115a . . . 115n and provides read data as outputs from selected CAM memory storage locations 115a . . . 115n. Additional multiplexers 115a . . . 110n are respectively coupled to the input stages of memory storage locations 115a . . . 115n. During a read operation, a memory storage location is selected by address signals 117 supplied to multiplexer 105 and the data stored in the selected memory storage location 115a . . . 115n is serially read out of the selected CAM memory storage location through multiplexer 105 onto a data output line 116, commencing with the low order bit of the selected CAM memory storage location.

The multiplexers 110a . . . 110n are used to maintain the current data in the recirculating CAM memory storage locations to which each of the multiplexers 110a . . . 110n are coupled by serially reading back in a stored data word as it is being read out during a read operation. The low order bit of a CAM memory storage location is rotated into the high order bit of the CAM memory storage location through one of the plurality of multiplexers 110a . . . 110n. The word select line 118 activates a particular multiplexer 110a . . . 110n and, thereby, the recirculating CAM memory storage location to which it is coupled. The word select line 118, used to select which multiplexer and associated recirculating CAM memory storage location pair is accessed, is received from an address decoder (not shown).

Data is written into a CAM memory storage location via the multiplexer 110a . . . 110n coupled to a particular CAM memory storage location selected based on the word select line 118. For a write operation a selected multiplexer receives input data from the write data line 121 and serially loads it into the associated memory storage location to which the selected multiplexer is coupled. Normally, the data in the recirculating CAM memory storage locations will be maintained by rotating data through the associated multiplexers 110a . . . 110n. However, during a write operation, new data present on the write input line of a selected multiplexer is loaded into the associated recirculating CAM memory storage location commencing with the high order bit. A write data line 121 is enabled for a selected multiplexer 110a . . . 110n when a write operation is required which causes the write enabled multiplexer to load input data on the write data line 121 into the selected memory storage location, rather than recirculating register data through as in a read or compare operation.

CAM memory storage locations 115a . . . 115n are further coupled to match detector 125, which comprises XOR gates 126a . . . 126n one for each memory storage location. Each XOR gate 126a . . . 126n of match detector 125 has one input coupled to an output stage of an associated memory storage location 115a . . . 115n and another input coupled to the output stage of comparand register 120 in order to perform bitwise comparisons between data in the low order bit of an associated memory storage location and data in the low order bit in the comparand register 120. This comparison is performed concurrently over all memory storage locations 115a . . . 115n. In the exemplary embodiment depicted in FIG. 1a, data is input to comparand register 120 in parallel; however, a serial input of comparand data may also be used.

Match detector 125 has outputs from each XOR gate coupled to a respective input of error detector circuit 130, which is constructed of a plurality of AND gates 131a . . . 131n and flip-flops 132a . . . 132n. In particular, an error flip-flop 132a . . . 132n has one input connected to the output of a corresponding XOR gate 126a . . . 126n of the match detector 125 and another input connected to the output of a clocking gate constructed as an AND gate 131a . . . 131n. The flip-flop outputs of error detector circuit 130 are respectively coupled to inputs of priority encoder 135, which indicates a priority, e.g., a highest priority of signals applied as inputs thereto. The AND gates operate so that when a clock signal is present and there is no match detected by XOR gates 126a . . . 126n for bits then being compared (output=1) then the flip-flops 132a . . . 132n are set to an error state. As each bit of a memory storage location is compared with a corresponding bit in the comparand register, the XOR gate outputs a "0" bit for a match and a "1" for a mismatch. The output of the XOR gates 126a . . . 126n causes respective AND gates 131a . . . 131n to allow error flip-flops 132a . . . 132n to operate when a clock signal is present to reverse or flip the outputs of the associated XOR gates 126a . . . 126n so that a "0" at the output of an associated error flip-flop 132a . . . 132n indicates a mismatch and a "1" at the output of an error flip-flop indicates a match. Once an error flip-flop operates to indicate a mismatch it cannot be changed again until the flip-flop is reset to a "1" output state, so that even if later compared bits of the same data word have a match, the error flip-flops 132a . . . 132n will indicate that there was a mismatch somewhere in the data word.

The operation of the entire CAM is completely synchronous. Even though data in the recirculating registers is constantly shifting, the exact timing of the beginning and the end of a memory storage location is known and fixed. This operation is, therefore, cyclical and the entire CAM array is shifted at every shift cycle. Search operations in the CAM are also synchronous to the shifting of data in the CAM and a search operation can start only at the beginning of a data shift cycle.

Prior to any search cycle, all error flip-flops are reset. Therefore, if data in a memory storage location in the CAM is a 100% match to data in the comparand, there are no mismatches detected in its comparator, the output of corresponding error flip-flop input will remain "1" indicating a matched data word. If a "0" is detected in any error flip-flop output, it can be concluded that there is no match between data in at least one of the bits of an associated memory storage location and data in the comparand register. If a "1" is detected on more than a single error flip-flop output, the priority encoder 135 points to the highest priority memory storage location with a match and outputs an address of that memory storage location.

Figure 1B:
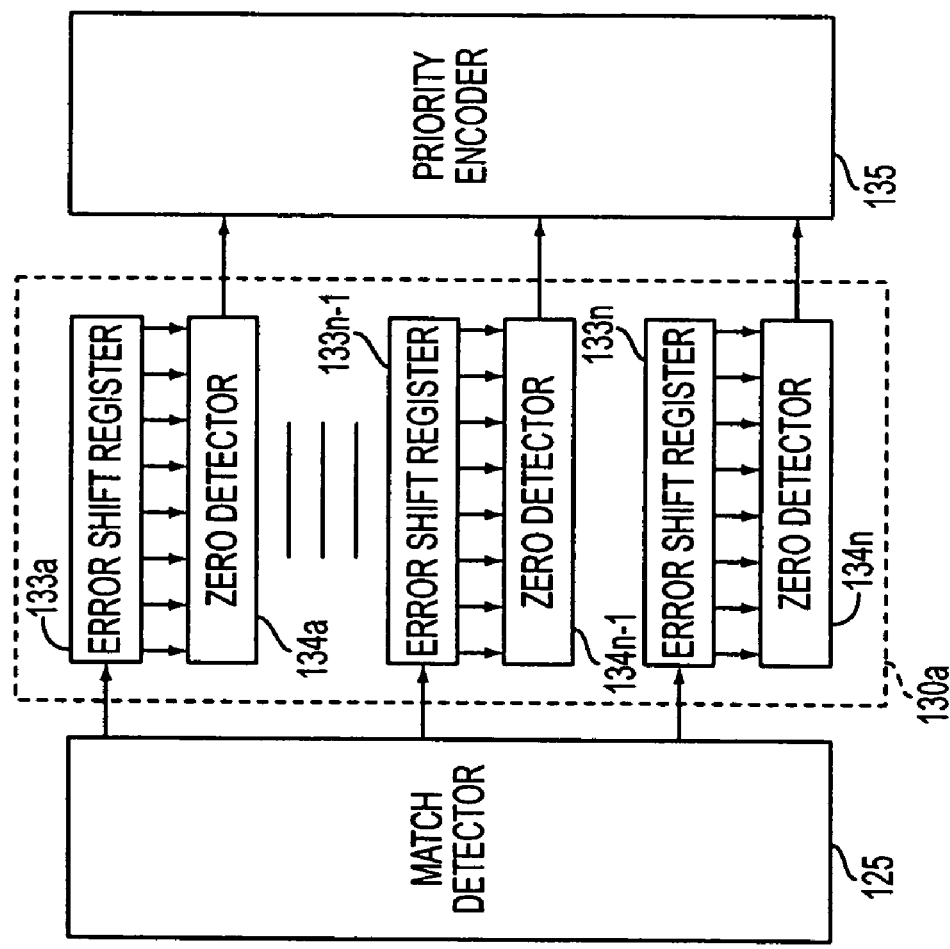
FIG. 1b is an exemplary embodiment of a error detector circuit using error shift registers of the present invention in block form.

Since in the recirculating CAM, only one data bit of each memory storage location (e.g., least significant bit) is compared to a corresponding data bit (e.g., least significant bit) in the comparand register, the XOR gate of each memory storage location flags every individual mismatching data bit in that memory storage location. FIG. 1b shows an alternate embodiment in which each mismatched bit is identified and stored. FIG. 1b shows a different error detector circuit 130a from that shown in FIG. 1a. Error detector circuit 130a includes error shift registers 133a . . . 133n respectively coupled to the XOR gates 126a . . . 126n (FIG. 1a) of match detector 125. The parallel stages of error shift registers 133a . . . 133n are coupled respectively to zero detectors 134a . . . 134n which are, in turn, respectively coupled to the inputs of priority encoder 135. In the FIG. 1b embodiment a "1" is shifted into an error shift register 133a . . . 133n every time a mismatch is detected by the associated XOR gates 126a . . . 126n and a "0" is shifted in each time a match is detected. Thus, the number of "1s" in the register at the end of the bit matching operation is indicative of the level of mismatch. An error shift register with all its bits at "0", indicates a perfect match of all bits of the compared stored word and word in the comparand register. A single "1" in the register, indicates an almost match condition, with only one mismatching bit, etc. In addition, the location of 1's in the shift register can be used in pattern matching algorithms to determine useful information on where matches/mismatches are occurring. Using a shift register for tracking errors as in the FIG. 1b embodiment, instead of an error flip-flop as in the FIG. 1a embodiment, enables the construction of a CAM capable of detecting not only perfect matches, as is the case of the CAM described above, but also detects a "close match", depending on the number of possible mismatches ("mismatch" tolerance), determined by the user. For this, each of the zero detectors 133a . . . 133n of FIG. 1b can be replaced with a respective logic circuit which indicates a match to the priority encoder 135 whenever the number of errors in the associated error shift registers 133a . . . 133n is less than a specified value. In this case, the priority encoder 135 outputs a highest priority closest match memory storage location address.

Figure 2:
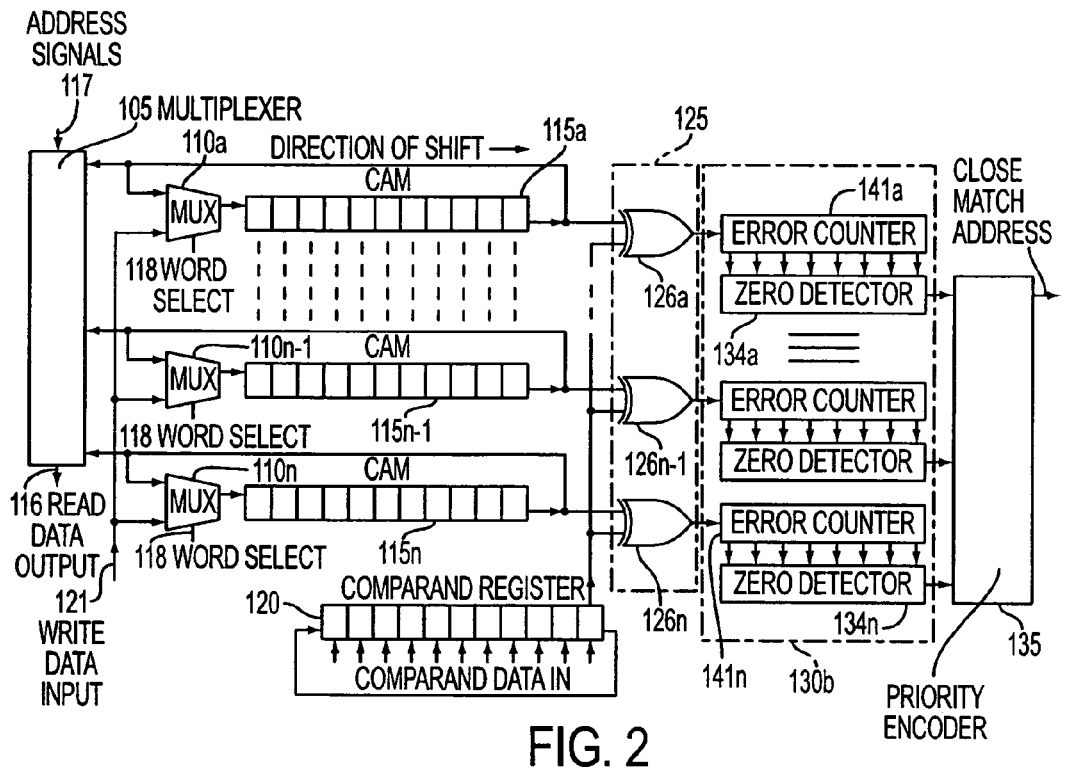
FIG. 2 is an exemplary embodiment of a recirculating serial shifting CAM of the present invention capable of detecting close matches.

FIG. 2 shows an exemplary embodiment of another recirculating CAM with "close match" detection capabilities. FIG. 2 is identical to FIG. 1a except that error detector circuit 130 of FIG. 1a has been replaced by error counter circuit 130b containing a plurality of error counters 141a . . . 141n and zero detectors 134a . . . 134n respectively coupled to the error counters 141a . . . 141n.

Error counters 141a . . . 141n keep track of the number of mismatches in the bit matching of a corresponding word in a memory storage location with a word in the comparand register 120. Though there are numerous ways for detecting the number of mismatches using a counter, FIG. 3a shows an exemplary embodiment of an error counter 141 with an associated zero detector 134, which indicates if the error counter 141 is equal to zero. In this arrangement, each mismatch increments counter error 141. After the search is completed the error counter 141 is decremented a number of times with the error counter 141 decremented down to a zero count. If the decrement value is, e.g., 2, then any word having two or less mismatches will decrement error counter 141 to zero and the zero detector 134 will indicate a match to the priority encoder 135 which will output the highest priority "close match" address.

Figure 3B:
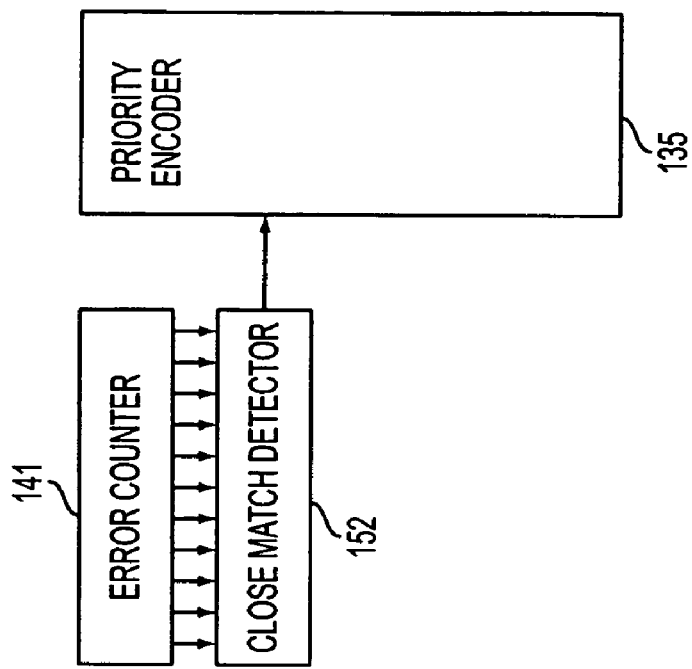
FIG. 3b is an exemplary embodiment of a close match detector coupled to error counters in accordance with the invention.
Figure 3A:
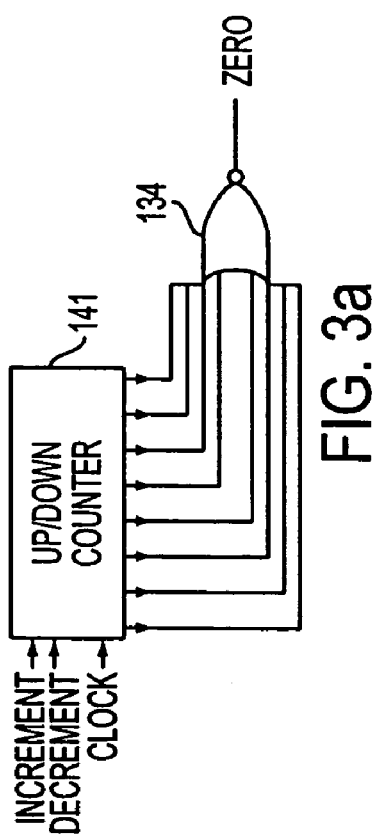
FIG. 3a is an exemplary embodiment of the error counter with zero detector of the present invention depicted in FIG. 2.

FIG. 3b is another exemplary embodiment of a close match detector coupled to each error counter 141. The close match detector 152 is set to the number of mismatches the system will tolerate as specified by a user. Using again two mismatches as an example, close match detector 152 will indicate a match to priority encoder 135.

Figure 4:
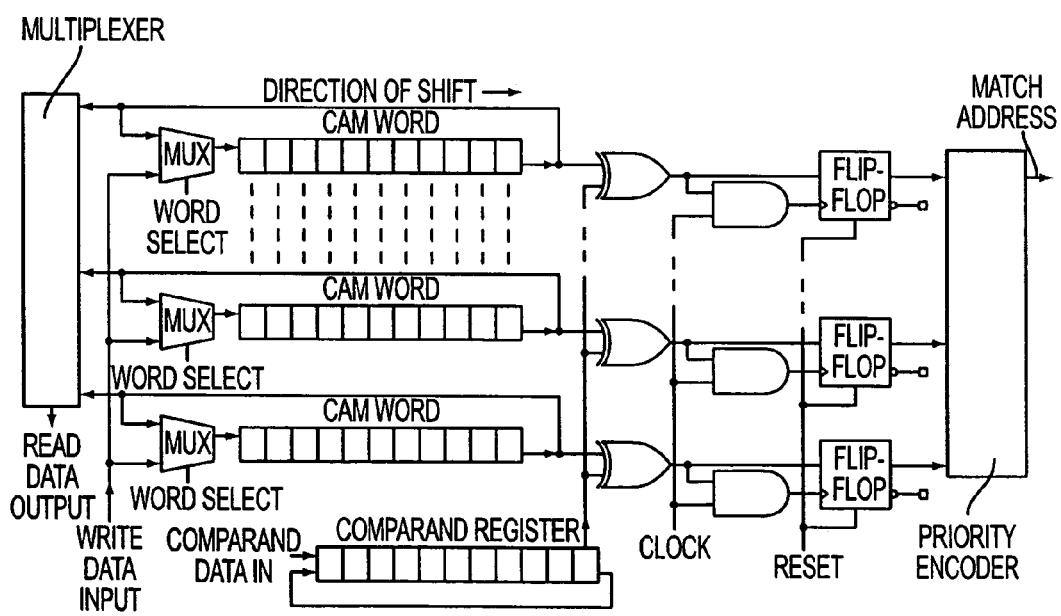
FIG. 4 is an exemplary embodiment of a recirculating serial shifting CAM of the present invention with a serial comparand input.
Figure 5:
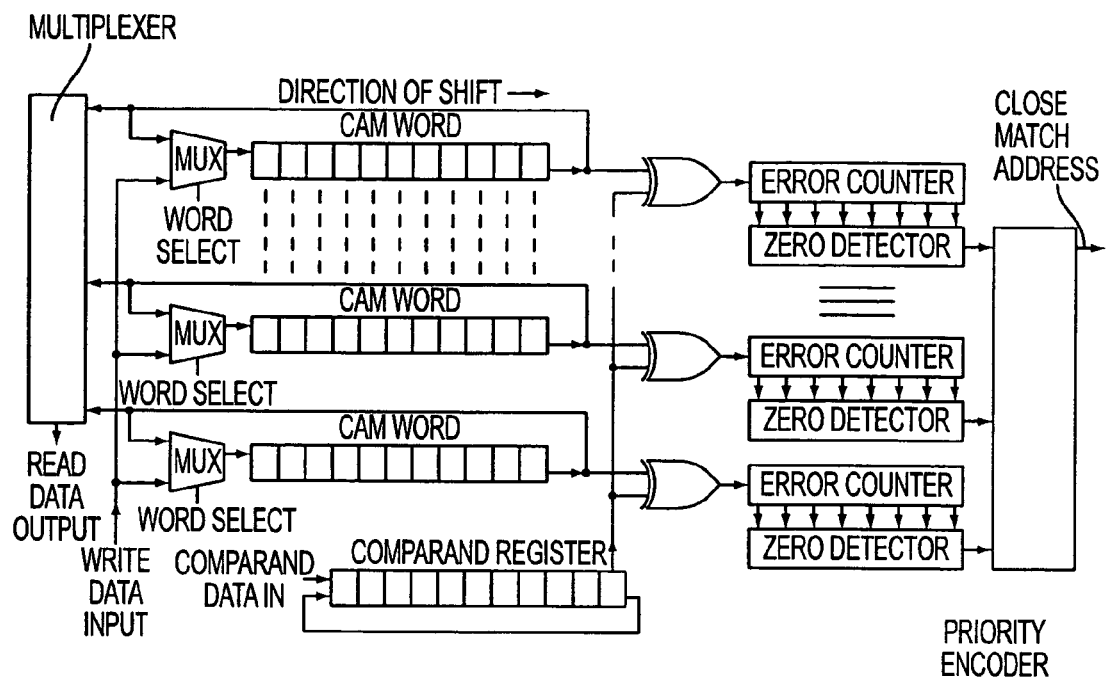
FIG. 5 is an exemplary embodiment of a recirculating serial shifting CAM of the present invention, capable of detecting close matches, including a serial comparand input register.
Figure 6:
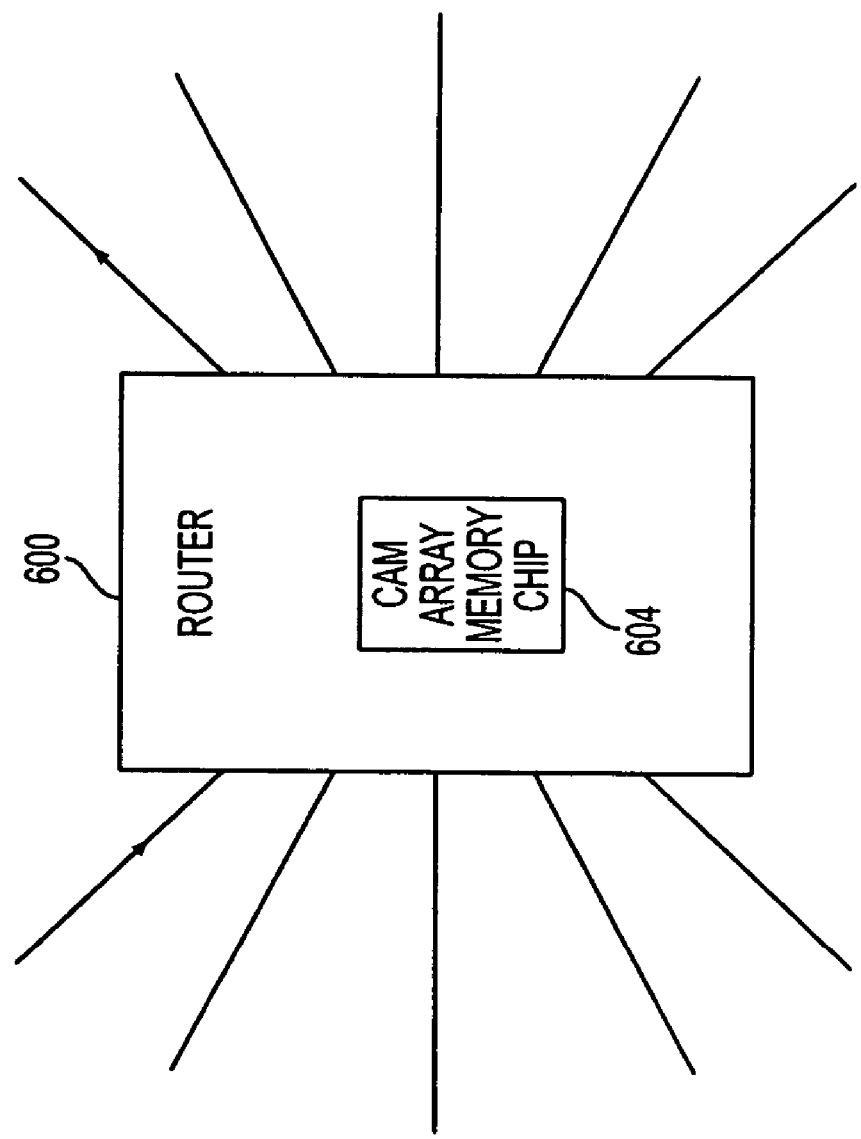
FIG. 6 is a simplified block diagram of a router connected to a CAM array memory chip as may be used in a communications network.

The exemplary embodiments of the CAM in FIGS. 1 and 6 show a comparand register in which the data is loaded in parallel. FIGS. 4 and 5 show exemplary embodiments of recirculating memory storage location CAMs with comparand registers in which data is shifted in a serial fashion. The exemplary embodiment depicted in FIG. 4 is identical to the embodiment depicted in FIG. 1a except that data is shifted into comparand register 120 serially in FIG. 4. FIG. 5 is identical to FIG. 2 except that data is shifted into comparand register 120 serially in FIG. 5.

FIG. 6 is a simplified block diagram of a router 1000 connected to a CAM array memory chip 1004 employing recirculating shift registers constructed as described above in connection with FIGS. 1–5. The router 1000 contains a plurality of input lines and a plurality of output lines. When data is transmitted from one location to another, it is sent in a form known as a packet. Oftentimes, prior to the packet reaching its final destination, that packet is first received by a router, or some other device. The router 1000 then decodes that part of the data identifying the ultimate destination and decides which output line and what forwarding instructions are required for the packet.

Figure 7:
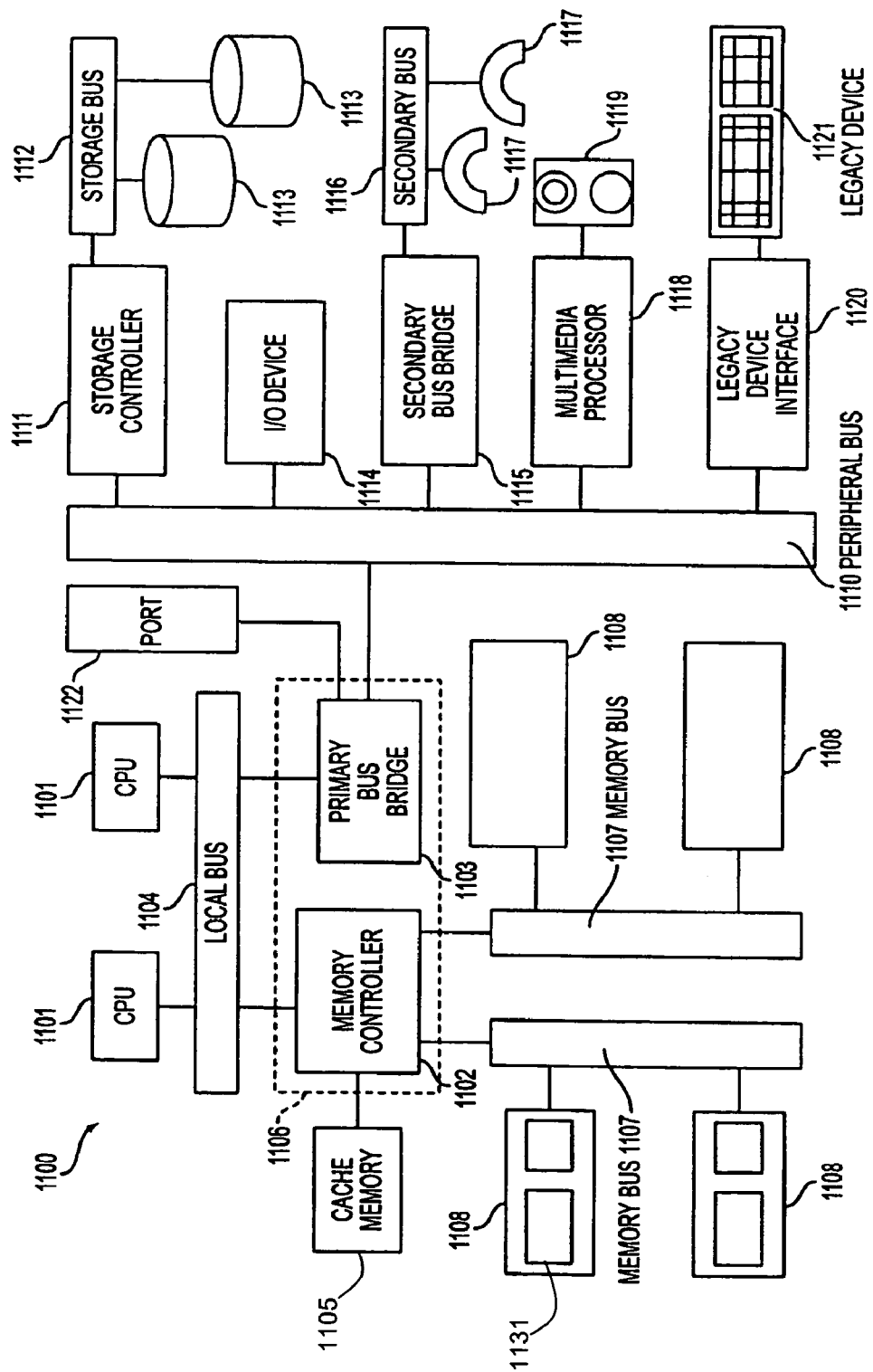
FIG. 7 is an exemplary computer system which may use the CAM of the present invention.

FIG. 7 illustrates an exemplary processing system 1100 which may utilize a recirculating CAM constructed in accordance with the invention described above in connection with FIGS. 1–5. The processing system 1100 includes one or more processors 1101 coupled to a local bus 1104. A memory controller 1102 and a primary bus bridge 1103 are also coupled the local bus 1104. The processing system 1100 may include multiple memory controllers 1102 and/or multiple primary bus bridges 1103. The memory controller 1102 and the primary bus bridge 1103 may be integrated as a single device 1106.

The memory controller 1102 is also coupled to one or more memory buses 1107. Each memory bus accepts memory components 1108 which include at least one recirculating CAM memory device 1131 using the present invention. The memory components 1108 may be a memory card or a memory module. Examples of memory modules include single inline memory modules (SIMMs) and dual inline memory modules (DIMMs). The memory controller 1102 may also be coupled to a cache memory 1105. The cache memory 1105 may be the only cache memory in the processing system. Alternatively, other devices, for example, processors 1101 may also include cache memories, which may form a cache hierarchy with cache memory 1105. If the processing system 1100 includes peripherals or controllers which are bus masters or which support direct memory access (DMA), the memory controller 1102 may implement a cache coherency protocol. If the memory controller 1102 is coupled to a plurality of memory buses 1107, each memory bus 1107 may be operated in parallel, or different address ranges may be mapped to different memory buses 1107.

The primary bus bridge 1103 is coupled to at least one peripheral bus 1110. Various devices, such as peripherals or additional bus bridges may be coupled to the peripheral bus 1110. These devices may include a storage controller 1111, a miscellaneous I/O device 1114, a secondary bus bridge 1115, a multimedia processor 1118, and a legacy device interface 1120. The primary bus bridge 1103 may also coupled to one or more special purpose high speed ports 1122. In a personal computer, for example, the special purpose port might be the Accelerated Graphics Port (AGP), used to couple a high performance video card to the processing system 1100.

The storage controller 1111 couples one or more storage devices 1113, via a storage bus 1112, to the peripheral bus 1110. For example, the storage controller 1111 may be a SCSI controller and storage devices 1113 may be SCSI discs. The I/O device 1114 may be any sort of peripheral. For example, the I/O device 1114 may be a local area network interface, such as an Ethernet card. The secondary bus bridge 1115 may be used to interface additional devices via another bus 1116 to the processing system. For example, the secondary bus bridge 1115 may be a universal serial port (USB) controller used to couple USB bus devices 1117 to the processing system 1100. The multimedia processor 1118 may be a sound card, a video capture card, or any other type of media interface, which may also be coupled to one additional devices such as speakers 1119. The legacy device interface 1120 is used to couple legacy devices 1121, for example, older styled keyboards and mice, to the processing system 1100.

The processing system 1100 illustrated in FIG. 7 is only an exemplary processing system with which a CAM constructed in accordance with the invention may be used. While FIG. 7 illustrates a processing architecture especially suitable for a general purpose computer, such as a personal computer or a workstation, it should be recognized that well known modifications can be made to configure the processing system 1100 to become more suitable for use in a variety of applications. In addition, for use in a router, a simpler processor architecture may be used to couple the CAM memory devices to a processor.

While the invention has been described and illustrated with reference to specific exemplary embodiments, it should be understood that many modifications and substitutions can be made without departing from the spirit and scope of the invention. Accordingly, the invention is not to be considered as limited by the foregoing description but is only limited by the scope of the appended claims.

The invention claimed is:

1. A method of operating a content addressable memory (CAM) device comprising:
    selecting, using a first multiplexer, one of a plurality of recirculating memory storage locations for a read operation;
    serially outputting contents of said selected recirculating memory storage location onto a data output line through said first multiplexer in response to said read operation; and
    serially applying, using a second multiplexer, an output bit of said selected recirculating memory storage location to an input of said selected memory storage location during said read operation
    wherein said selected recirculating memory storage location comprises only a single shift register, and
    wherein said second multiplexer receives data to be written to said plurality of memory storage locations during a write operation from an external source.

2. The method according to claim 1, wherein said plurality of recirculating memory storage locations are constructed of flip-flops.

3. A method of operating a content addressable memory (CAM) device comprising:
    selecting, using a first multiplexer, one of a plurality of recirculating memory storage locations for a read operation;
    selecting, by applying a word select signal to a second multiplexer, one of a plurality of recirculating memory storage locations for a write operation; and
    serially inputting data present on a write data line to said selected recirculating memory storage location, through said second multiplexer, in response to said write operation,
    wherein said selected recirculating memory storage location comprises only a single shift register, and
    wherein said write data line receives said serially input data during said write operation from an external source.

4. The method according to claim 3, wherein each of said plurality of recirculating memory storage locations are constructed of flip-flops.

5. A content addressable memory (CAM) device comprising:
    means for selecting one of a plurality of recirculating memory storage locations for a read operation;
    means for serially outputting contents of said selected recirculating memory storage location onto a data output line in response to said read operation using said selecting means; and
    means for serially applying an output bit of said selected recirculating memory storage location to an input of said selected memory storage location during said read operation,
    wherein said selected recirculating memory storage location comprises only a single shift register, and
    wherein said means for serially applying an output bit receives data to be written to said plurality of memory storage locations during a write operation from an external source.

6. The content addressable memory device according to claim 5, wherein said plurality of recirculating memory storage locations are constructed of flip-flops.

7. A content addressable memory (CAM) device comprising:
    means for selecting one of a plurality of recirculating memory storage locations for a read operation, said means comprising means for activating a first multiplexer connected to said selected recirculating memory storage location;
    means for selecting one of a plurality of recirculating memory storage locations for a write operation, said means comprising means for activating a second multiplexer connected to said selected recirculating memory storage location; and
    means for serially inputting data present on a write data line to said selected recirculating memory storage location through said second multiplexer in response to said write operation,
    wherein said selected recirculating memory storage location comprises only a single shift register, and
    wherein said write data line receives said serially input data during said write operation from an external source.

8. The content addressable memory device according to claim 7, wherein each of said plurality of recirculating memory storage locations are constructed of flip-flops.

* * * * *

UNITED STATES PATENT AND TRADEMARK OFFICE
CERTIFICATE OF CORRECTION

| | | |
|---|---|---|
| PATENT NO. | : 7,107,392 B2 | Page 1 of 1 |
| APPLICATION NO. | : 10/952728 | |
| DATED | : September 12, 2006 | |
| INVENTOR(S) | : Alon Regev et al. | |

It is certified that error appears in the above-identified patent and that said Letters Patent is hereby corrected as shown below:

On Title Page, Item (56)
In the Other Publications portion of References Cited, the following error is corrected:

"John F. Wakely, Digital Design Principles and Practices, 1990, Prentice Hall, pp. XV, 466."

Should read

--John F. Wakerly, Digital Design Principles and Practices, 1990, Prentice Hall, pp. XV, 466.--.

Column 7, lines 22-23, "to one additional" should read --to additional--.

Signed and Sealed this

Ninth Day of January, 2007

JON W. DUDAS
*Director of the United States Patent and Trademark Office*